(12) United States Patent
Torii et al.

(10) Patent No.: US 7,067,900 B2
(45) Date of Patent: Jun. 27, 2006

(54) INSULATED GATE BIPOLAR TRANSISTOR HAVING A REDUCED TAIL CURRENT AND METHOD OF FABRICATING THE SAME

(75) Inventors: Katsuyuki Torii, Saitama (JP); Ryoji Takahashi, Saitama (JP)

(73) Assignee: Sanken Electric Co., Ltd. (JP)

( * ) Notice: Subject to any disclaimer, the term of this patent is extended or adjusted under 35 U.S.C. 154(b) by 0 days.

(21) Appl. No.: 10/993,604

(22) Filed: Nov. 19, 2004

(65) Prior Publication Data

US 2005/0110075 A1   May 26, 2005

(30) Foreign Application Priority Data

Nov. 20, 2003  (JP) .............................. 2003-390968

(51) Int. Cl.
*H01L 27/082* (2006.01)
(52) U.S. Cl. ................................ 257/565; 257/E27.055
(58) Field of Classification Search .................... None
See application file for complete search history.

(56) References Cited

U.S. PATENT DOCUMENTS 5,436,176 A *  7/1995 Shimizu et al.
6,204,097 B1 *  3/2001 Shen et al.

FOREIGN PATENT DOCUMENTS

JP           05-055583          3/1993

* cited by examiner

*Primary Examiner*—Nathan Flynn
*Assistant Examiner*—Kevin Quinto
(74) *Attorney, Agent, or Firm*—Townsend and Townsend and Crew

(57) ABSTRACT

An IGBT has an N-type buffer region between a P-type collector region and a P-type base region. The buffer region includes arsenic as a N-type impurity. The buffer region is formed to have a relatively high impurity concentration of equal to or greater than $5 \times 10^{17}$ cm-3 and a relatively small thickness of 2 to 10 μm.

6 Claims, 2 Drawing Sheets

INSULATED GATE BIPOLAR TRANSISTOR HAVING A REDUCED TAIL CURRENT AND METHOD OF FABRICATING THE SAME

CROSS-REFERENCES TO RELATED APPLICATIONS

The present application claims priority to Japanese Application No. 2003-390968, filed on Nov. 20, 2003, and is incorporated herein by this reference.

BACKGROUND OF THE INVENTION

1. Field of the Invention

The present invention relates to an insulated gate bipolar transistor and a method of fabricating the same.

2. Description of the Related Art

An insulated gate bipolar transistor (hereinafter referred to as IGBT) has high input impedance of a field effect transistor and a high current drive capability of a bipolar transistor, and is particularly suitable for use as a power switching device.

An IGBT has such a problem that as the density of current flowing through the device increases, the parasitic thyristor is turned on so that the device is likely to go to a latch-up state in which case the device may be broken. To suppress the occurrence of the latch-up, a device with a buffer region is developed as disclosed in Unexamined Japanese Patent Application KOKAI Publication No. H5-55583.

The conventional IGBT with a buffer region comprises a semiconductor substrate, a collector electrode, an emitter electrode, a gate insulating layer, and a gate electrode. The semiconductor substrate includes a P-type collector region, an $N^+$-type buffer region provided on the collector region, an N-type base region provided on the buffer region and having a lower impurity concentration than that of the $N^+$-type buffer region, a P-type base region formed like lands in the surface region of the N-type base region, and an N-type emitter region formed like lands in the surface region of the P-type base region.

The collector electrode is electrically connected to the collector region. The emitter electrode is electrically connected to the emitter region. The gate electrode is formed on the P-type base region, sandwiched between the N-type base region and the emitter region, via the gate insulating layer.

In the IGBT, the buffer region has a capability of optimizing (suppressing) the amount of holes to be injected into the N-type base region from the collector region and preventing the latch-up. When the N-type base region is formed directly on the collector region with no buffer region formed, more than necessary holes are injected into the N-type base region from the collector region, making the occurrence of the latch-up easier. The buffer region suppresses the latch-up and improves the reliability of the device.

The IGBT with the buffer region however has a problem such that the so-called tail current is large so that the switching speed is apt to become slower. This seems to be attributed to the following reason. When the device is turned off with the voltage to be applied to the gate electrode being set equal to or lower than a threshold voltage Vth, the PN junction formed at the interface between the N-type base region and the P-type base region is reverse-biased, causing the depletion layer to extend into the N-type base region from the PN junction. At this time, minority carriers (holes) stored in the N-type base region are discharged via the P-type base region. As the depletion layer does not substantially extend into the buffer region, however, the carriers stored in the buffer region are not discharged. Accordingly, the current (tail current) keeps flowing until the minority carriers stored in the buffer region are recombined. As a result, the switching speed of the IGBT becomes slower.

The buffer region of an IGBT is generally formed by diffusing phosphorus. Phosphorus is so easily diffused that it may be diffused into the N-type base region by the heat generated in the fabrication process of the device. Due to phosphorus being diffused in the fabrication process of the device, the buffer region is formed thick with a low impurity concentration when the device is completed as an IGBT. Consequently, the completed IGBT becomes more likely to store holes in the buffer region and takes a longer time to get the holes recombined to vanish, allowing the tail current to be large.

There may be considered a method for forming the buffer region thin, for precaution against the possibility of phosphorus being diffused in the fabrication process of the device. In this case, however, the phosphorous concentration in the buffer region should be made higher. This results in sharp concentration gradient with respect to other layers, causing diffusion of a greater amount of phosphorus. Therefore, the buffer region eventually becomes thick and the impurity concentration cannot be increased sufficiently. In other words, the problem that the tail current is likely to become large is not solved.

On the other hand, there are methods for applying electron irradiation, heavy metal diffusion, or the like, for decreasing the tail current. However, these methods cause defects inside the device, which leads to degradation of device characteristics, such as increase in collector-emitter voltage VCE (sat), which is a critical characteristic of an IGBT, decrease in threshold voltage Vth, and increase in leak current when a reverse voltage is applied between the collector and the emitter. These methods cause not only such degradation of device characteristics, but also other bad effects such as large change in device characteristics at a high working temperature. Furthermore, these methods give rise to a problem that the frequency of occurrence of switching loss is greatly increased during device operation at a high temperature.

As described above, a conventional IGBT having a buffer region formed with phosphorus has a problem that it is difficult to decrease the tail current and promote a higher switching speed while maintaining the device characteristics good, because it is difficult to form the buffer region thin with a high impurity concentration.

BRIEF SUMMARY OF THE INVENTION

To solve the above-described problem, an object of the present invention is to provide an insulated gate bipolar transistor having a high switching speed, and a method of fabricating the same. Another object of the present invention is to provide an insulated gate bipolar transistor having a reduced tail current, and a method of fabricating the same.

To achieve the above objects, according to a first aspect of the present invention, there is provided an insulated gate bipolar transistor which comprises:

a P-type collector region;

an N-type buffer region which is formed on the P-type collector region;

an N-type base region which is formed on the N-type buffer region and has an impurity concentration lower than that of the N-type buffer region;

a P-type base region which is formed in a surface region of the N-type base region; and an N-type emitter region which is formed in a surface region of the P-type base region, wherein the N-type buffer region includes arsenic as an N-type impurity at an impurity concentration of equal to or greater than $5\times10^{17}$ cm$^{-3}$, and has a thickness of 2 μm to 10 μm.

To achieve the above objects, according to a second aspect of the present invention, there is provided a method of fabricating an insulated gate bipolar transistor having a P-type collector region, an N-type buffer region which is formed on the P-type collector region, an N-type base region which is formed on the N-type buffer region and has an impurity concentration lower than that of the N-type buffer region, a P-type base region which is formed in a surface region of the N-type base region, and an N-type emitter region which is formed in a surface region of the P-type base region. According to this method, the N-type buffer region is formed by diffusing arsenic, as an N-type impurity, at an impurity concentration of equal to or greater than 5×1017 cm-3, and in such a way that the region has a thickness of 2 μm to 10 μm.

According to the present invention, it is possible to provide an insulated gate bipolar transistor having a high switching speed, and a method of fabricating the same. Further, according to the present invention, it is possible to provide an insulated gate bipolar transistor having a reduced tail current, and a method of fabricating the same.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE INVENTION

An insulated gate bipolar transistor (hereinafter referred to as IGBT) according to an embodiment of the present invention will now be described in detail with reference to the drawings.

Figure 1:
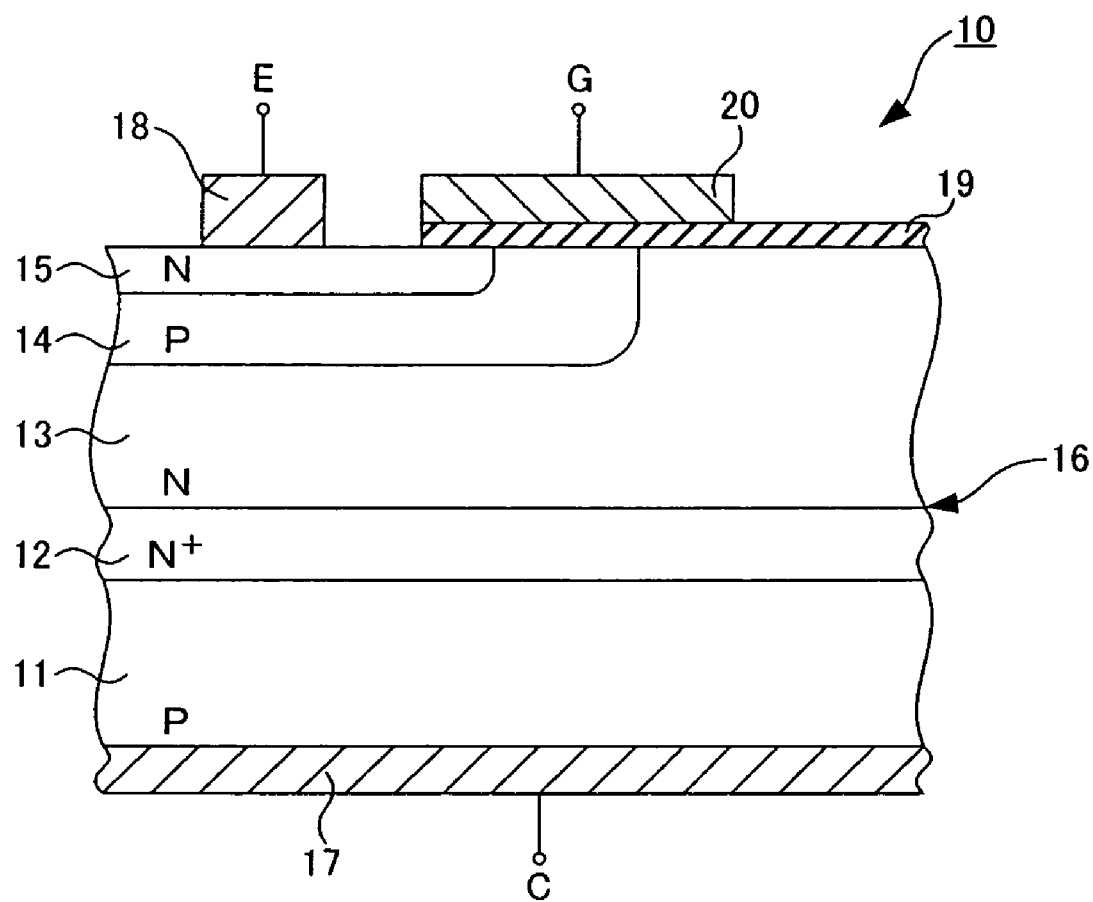
FIG. 1 is a diagram showing a cross sectional structure of an IGBT according to an embodiment of the present invention.

As shown in FIG. 1, the IGBT 10 comprises a semiconductor substrate 16, a collector electrode 17, an emitter electrode 18, an insulation film 19, and a gate electrode 20. The semiconductor substrate 16 includes a P-type collector region 11, a buffer region 12, an N-type base region 13, a P-type base region 14, and an emitter region 15.

The collector region 11 is comprised of a semiconductor region having a P-type impurity such as boron diffused, e.g., a P-type silicon semiconductor substrate. The collector region 11 is formed, for example, with a thickness of about 100 to 300 μm and at an impurity concentration of about $1\times10^{18}$ cm$^{-3}$. The collector region 11 constitutes one surface of the semiconductor substrate 16, on which one surface the collector electrode 17 made of aluminum or the like is provided.

The buffer region 12 is comprised of an N-type semiconductor region having arsenic (As) diffused as an N-type impurity. The buffer region 12 is formed on one surface of the collector region 11 by epitaxial growth. The impurity concentration of the buffer region 12 is, for example, equal to or greater than $5\times10^{17}$ cm$^{-3}$, and is set to be higher than the concentration of the P-type impurity of the collector region 11. The buffer region 12 is formed to have a thickness of, for example, equal to or greater than 2 μm and equal to or smaller than 10 μm, and preferably equal to or greater than 2 μm and equal to or smaller than 5 μm.

By forming the N-type buffer region to have a thickness of equal to or greater than 2 μm, it is possible to effectively suppress injection of holes into an N-type base region and suitably prevent latch-up. On the other hand, by forming the N-type buffer region to have a thickness of equal to or smaller than 10 μm, it is possible to maintain a high current drive capability without excessively suppressing injection of holes into the N-type base region. Furthermore, by forming the N-type buffer region to have an impurity concentration of equal to or greater than $5\times10^{17}$ cm$^{-3}$, it is possible to make an increase in the total amount of donor impurity larger than an increase in the total amount of stored carriers which increase accompanies an increase in the thickness of the N-type buffer region. As a result, it is possible to make the switching speed higher.

The N-type base region 13 is comprised of a semiconductor region which is formed on one surface of the buffer region 12 and has an N-type impurity such as phosphorus or the like diffused. The N-type base region 13 may be formed on the buffer region 12 by epitaxial growth. The N-type base region 13 is formed to have a lower impurity concentration than that of the buffer region 12, for example, an impurity concentration of about $1\times10^{14}$ cm$^{-3}$, and to have a thickness of about 50 μm.

One P-type base region 14 or plural P-type base regions 14 are formed like lands in the surface region of the N-type base region 13, and each is comprised of a semiconductor region having a P-type impurity such as boron or the like diffused. The P-type base region 14 is formed to have an impurity concentration of, for example, about $1\times10^{17}$ cm$^{-3}$ and a diffusion depth of, for example, about 4 μm.

The emitter region 15 is formed in the surface region of the P-type base region 14, and is comprised of a semiconductor region having an N-type impurity such as phosphorus or the like diffused. The emitter region 15 is formed to have an impurity concentration of, for example, about $1\times10^{19}$ cm$^{-3}$ and a diffusion depth of, for example, about 0.5 μm. The emitter region 15 is electrically connected to the emitter electrode 18 made of aluminum or the like.

The collector electrode 17, which is made of aluminum or so, is formed on one surface of the collector region. The emitter electrode 18, which is made of aluminum or so, is electrically connected to the emitter region. The gate electrode 20, made of polysilicon or so, is formed on the P-type base region 14 (channel region) sandwiched between the emitter region 15 and the N-type base region 13, via the gate insulating layer 19.

In the IGBT 10 with the above-described structure, the buffer region 12 is provided to restrain occurrence of the latch-up of the device and enhance the reliability of the device.

The "latch-up" is the following phenomenon. A parasitic NPN transistor comprised of the N-type base region 13, the P-type base region 14, and the N-type emitter region 15, is formed in the IGBT 10. The parasitic NPN transistor, together with a PNP transistor comprised of the collector region 11, the buffer region 12, the N-type base region 13 and the P-type base region 14, forms a parasitic thyristor. If the thyristor operates, the current that flows through the thyristor cannot be inhibited when the IGBT 10 is off, and the IGBT 10 causes thermal runaway and is damaged.

If the N-type base region 13 is formed directly on the collector region 11 without forming the buffer region 12, more than necessary holes are injected into the N-type base region 13 from the collector region 11, making the occurrence of latch-up easier.

With the buffer region 12 formed, however, when a voltage equal to or lower than a threshold voltage Vth is applied between the collector and emitter of the IGBT 10 in the off state, the buffer region 12 optimizes (suppresses) the amount of holes to be injected into the N-type base region 13 from the collector region 11 in the off process. The provision of the buffer region 12 can therefore suppress occurrence of the latch-up and improve the reliability of the device.

The provision of the buffer region 12 generally slows down the switching speed of the IGBT 10. That is, when the IGBT 10 is off, the PN junction formed at the interface between the N-type base region 13 and the P-type base region 14 is reverse-biased and the depletion layer extends into the N-type base region 13 from the PN junction. At this time, the carriers (holes) stored in the N-type base region 13 are discharged from the emitter electrode 18 via the P-type base region 14. Because the depletion layer does not substantially extend into the buffer region 12, however, the carriers stored in the buffer region 12 are not discharged. Accordingly, the current (so-called tail current) keeps flowing until the carriers stored in the buffer region 12 are recombined. As a result, the switching speed of the IGBT 10 becomes slow.

To reduce the carriers to be stored in the buffer region 12, therefore, it is preferable that the buffer region 12 should be as thin as possible. To accelerate the recombination of the carriers stored in the buffer region 12, it is preferable to set the impurity concentration of the buffer region 12 high. However, phosphorus which is used in the buffer region 12 generally has a high diffusion coefficient in the semiconductor region and is diffused in the heat treatment in the device fabrication process. This makes it difficult to form the buffer region 12 thin and at a high impurity concentration.

In this respect, the buffer region 12 in the IGBT 10 according to the embodiment is formed by using arsenic. This restrains substantial enlargement of the buffer region 12 which would be originated from the diffusion of the impurity (arsenic) in the heat treatment in the device fabrication process.

To be more specific, the diffusion coefficient of arsenic is lower than that of phosphorus by about one figure. Therefore, the buffer region 12 is prevented from being formed thick, which thickening is due to the N-type impurity being diffused into the N-type base region 13 in the heat treatment carried out for forming the N-type base region 13, the P-type base region 14, the emitter region 15, etc., which are formed after the buffer region 12 is formed. Accordingly, the amount of holes stored in the buffer region 12 when the device is off can be reduced, and also the tail current can be reduced due to the effect of prompting recombination of the holes. As a result, a higher switching speed can be obtained.

Further, the solid solubility of arsenic is equal to or greater than that of phosphorus. Therefore, with the use of arsenic, the buffer region 12 can be formed to have a high impurity concentration of preferably $5 \times 10^{17}$ cm$^{-3}$ or greater. Accordingly, even if the buffer region 12 is formed to have a relatively small thickness of, for example, 2 to 5 µm, injection of holes into the N-type base region 13 can be effectively suppressed and a latch-up can be prevented. As the buffer region 12 comes to have a thinner body and a higher impurity concentration, the amount of carriers stored therein can further be reduced. This makes it possible for the IGBT 10 to obtain a higher switching speed while maintaining a high device reliability.

Furthermore, since the buffer region 12 is formed by epitaxial growth, the gradient of impurity concentration can be made sharper as compared with a case where the buffer region 12 is formed by impurity diffusion. That is, the interface between the collector region 11 and the buffer region 12 can be made into a so-called step junction, which allows the thin buffer region 12 to effectively suppress the hole injection and further enhance the latch-up resistance.

These effects eliminate the necessity of electron irradiation or the like carried out for reducing the tail current, and therefore eliminate the possibility of occurrence of defects inside the device, which might be caused by electron irradiation or the like. Furthermore, such a device having the buffer region 12 formed with arsenic can be fabricated through the same steps as for fabricating a device with the use of other impurities such as phosphorus, i.e., can be fabricated without a substantial increase in the number of steps required.

With the use of the above-described device in which arsenic is used for the buffer region 12, the IGBT 10 according to the present embodiment can obtain decrease in the tail current, i.e., increase in the switching speed, and can be free from the problem of frequent occurrence of switching loss during device operation at a high temperature. Further, since the IGBT 10 according to the present embodiment is not subjected to electron irradiation, it does not cause increase in the collector-emitter voltage VCE (sat), decrease in the threshold voltage Vth, increase in the leak current, or the like.

Figure 2A:
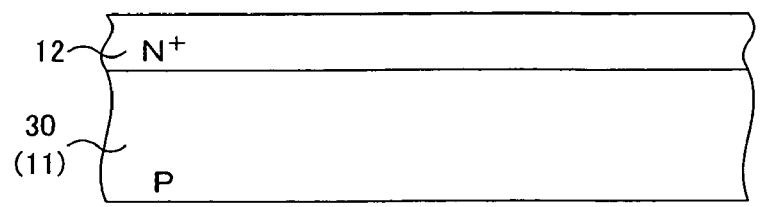
FIGS. 2A to 2C are diagrams showing a fabrication process of the IGBT according to the embodiment of the present invention.
Figure 2B:
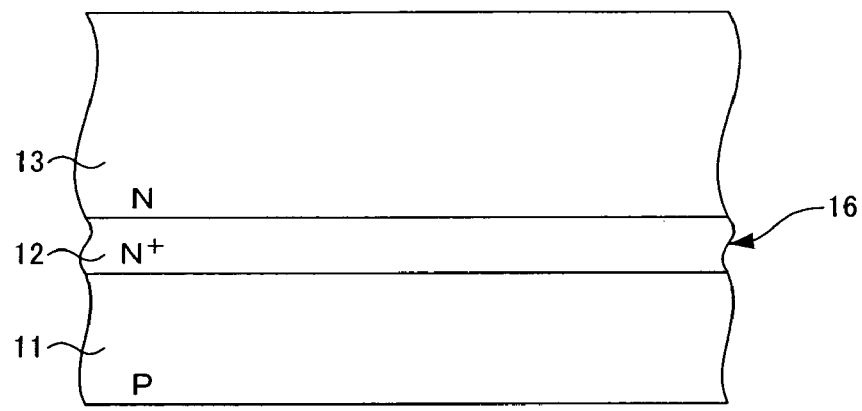
Figure 2C:
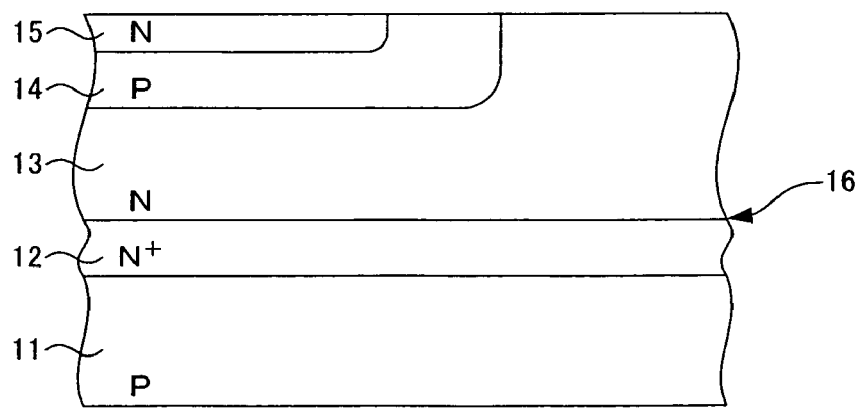

Next, a method of fabricating the IGBT 10 having the above-described structure will be explained with reference to the drawings. FIGS. 2A to 2C show the fabrication process of the IGBT 10 according to the present embodiment. The method to be described below is just an example, and the present invention is not limited to this method as long as any other methods are available that can obtain a similar device First, a P-type semiconductor substrate 30 is prepared, in which a P-type impurity such as boron or the like is doped. Then, as shown in FIG. 2A, an epitaxial growth layer (buffer region 12) including arsenic as an N-type impurity is formed on the semiconductor substrate 30 by a general epitaxial growth method.

Then, as shown in FIG. 2B, the N-type base region 13 including an N-type impurity such as phosphorus or the like is formed on the buffer region 12 by epitaxial growth. The buffer region 12 and the N-type base region 13 may be sequentially formed in a same apparatus.

Then, as shown in FIG. 2C, the P-type base region 14 and the emitter region 15 are formed in this order, by sequentially diffusing a P-type impurity and an N-type impurity selectively into predetermined surface regions of the N-type base region 13.

After this, the collector electrode 17, the emitter electrode 18, the gate electrode 20, and the like are formed on the semiconductor substrate 16 which has been obtained in this manner, thereby completing the IGBT 10 as shown in FIG. 1.

By employing the above-described device structure, there can be provided a method of fabricating an insulated gate bipolar transistor having a reduced tail current, i.e., an improved switching speed.

The present invention is not limited to the above-described embodiment, but has various other applications or modifications.

For example, according to the above-described embodiment, the buffer region 12 is formed as an epitaxial growth layer. However, the buffer region 12 is not limited to this but may be a diffusion layer formed in a diffusing manner. In this case, the collector region 11 and the buffer region 12 may be formed by diffusing arsenic over one surface of the P-type semiconductor substrate with a predetermined depth, preferably a diffusion depth of 5 μm or smaller.

Various embodiments and changes may be made thereunto without departing from the broad spirit and scope of the invention. The above-described embodiment is intended to illustrate the present invention, not to limit the scope of the present invention. The scope of the present invention is shown by the attached claims rather than the embodiment. Various modifications made within the meaning of an equivalent of the claims of the invention and within the claims are to be regarded to be in the scope of the present invention.

This application is based on Japanese Patent Application No. 2003-390968 filed on Nov. 20, 2003 and including specification, claims, drawings and summary. The disclosure of the above Japanese Patent Application is incorporated herein by reference in its entirety.

What is claimed is:

1. An insulated gate bipolar transistor comprising:
   a P-type collector region;
   an N-type buffer region which is formed on said P-type collector region;
   an N-type base region which is formed on said N-type buffer region and has an impurity concentration lower than that of said N-type buffer region;
   a P-type base region which is formed in a surface region of said N-type base region; and
   an N-type emitter region which is formed in a surface region of said P-type base region,
   wherein said N-type buffer region includes arsenic as an N-type impurity at an impurity concentration of equal to or greater than $5\times^{17}$ cm$^{-3}$, and has a thickness of 2 μm to 10 μm, and
   wherein an impurity concentration of the N-type impurity in said N-type buffer region is higher than an impurity concentration of a P-type impurity in said P-type collector region.

2. The insulated gate bipolar transistor according to claim 1, wherein said N-type buffer region is not subjected to electron irradiation.

3. The insulated gate bipolar transistor according to claim 1, wherein said N-type buffer region is constituted by an epitaxial growth layer.

4. A method of fabricating an insulated gate bipolar transistor having a P-type collector region, an N-type buffer region which is formed on said P-type collector region, an N-type base region which is formed on said N-type buffer region and has an impurity concentration lower than that of said N-type buffer region, a P-type base region which is formed in a surface region of said N-type base region, and an N-type emitter region which is formed in a surface region of said P-type base region,
   wherein said N-type buffer region is formed by diffusing arsenic, as an N-type impurity, at an impurity concentration of equal to or greater than $5\times10^{17}$ cm$^{-3}$, and in such a way that said region has a thickness of 2 μm to 10 μm.
   wherein an impurity concentration of the N-type impurity in said N-type buffer region is made higher than an impurity concentration of a P-type impurity in said P-type collector region.

5. The method of fabricating the insulated gate bipolar transistor according to claim 4, wherein said N-type buffer region is formed by epitaxial growth.

6. The method of fabricating the insulated gate bipolar transistor according to claim 5, wherein said N-type buffer region is not subjected to electron irradiation.

* * * * *